(12) United States Patent
Liu et al.

(10) Patent No.: US 10,756,148 B2
(45) Date of Patent: Aug. 25, 2020

(54) INKJET PRINTING OLED DISPLAY PANEL AND MANUFACTURING METHOD FOR THE SAME

(71) Applicant: Shenzhen China Star Optoelectronics Semiconductor Display Technology Co., Ltd., Shenzhen, Guangdong (CN)

(72) Inventors: Fangmei Liu, Guangdong (CN); Zhaosong Liu, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/009,614

(22) Filed: Jun. 15, 2018

(65) Prior Publication Data

US 2019/0214443 A1   Jul. 11, 2019

Related U.S. Application Data

(63) Continuation of application No. PCT/CN2018/079002, filed on Mar. 14, 2018.

(30) Foreign Application Priority Data

Jan. 9, 2018  (CN) .......................... 2018 1 0020268

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 27/3248* (2013.01); *H01L 27/3258* (2013.01);
(Continued)

(58) Field of Classification Search
CPC ............. H01L 27/3246; H01L 27/3248; H01L 27/3258; H01L 51/0005; H01L 51/0018; H01L 51/56; H01L 51/004; H01L 27/3262

See application file for complete search history.

(56) References Cited

U.S. PATENT DOCUMENTS

| 2013/0062596 A1* | 3/2013 | Ando ...................... H01L 51/56 257/40 |
| 2015/0001485 A1* | 1/2015 | Kang .................. H01L 51/0005 257/40 |

(Continued)

FOREIGN PATENT DOCUMENTS

CN        105206643 A        12/2015

OTHER PUBLICATIONS

CN 105206643, IDS Document of Record (Year: 2015).*

*Primary Examiner* — Patricia D Reddington
(74) *Attorney, Agent, or Firm* — Leong C. Lei

(57) ABSTRACT

An inkjet printing OLED display panel and manufacturing method are provided. The method includes sequentially forming a passivation layer and a planarization layer on thin-film transistors on a glass substrate, and the passivation layer covers the thin-film transistors; forming vias both at the passivation layer and the planarization layer; forming anodes on the planarization layer, and the anodes are electrically connected to the thin-film transistors through the vias; depositing a pixel definition layer on the planarization layer, and the pixel definition layer covers the anodes; using a half-tone mask to define a pattern of the pixel definition layer such that a region of the pixel definition layer located above the anodes forms a notch, and a height of the pixel definition layer located between the anodes is decreased;

(Continued)

using an inkjet printing technology to form a light-emitting layer in the notch of the pixel definition layer.

16 Claims, 4 Drawing Sheets

(52) U.S. Cl.
CPC ...... *H01L 51/0005* (2013.01); *H01L 51/0018* (2013.01); *H01L 51/56* (2013.01); *H01L 27/3262* (2013.01); *H01L 51/004* (2013.01); *H01L 2227/323* (2013.01); *H01L 2251/301* (2013.01); *H01L 2251/303* (2013.01); *H01L 2251/308* (2013.01); *H01L 2251/558* (2013.01)

(56) References Cited

U.S. PATENT DOCUMENTS

2016/0018575 A1\* 1/2016 Chen ................. G02F 1/133514
359/887
2018/0158886 A1\* 6/2018 Dong ................. H01L 51/5209

\* cited by examiner

INKJET PRINTING OLED DISPLAY PANEL AND MANUFACTURING METHOD FOR THE SAME

CROSS REFERENCE

This application is a continuing application of PCT Patent Application No. PCT/CN2018/079002, entitled "INKJET PRINTING OLED DISPLAY PANEL AND MANUFACTURING METHOD FOR THE SAME", filed on Mar. 14, 2018, which claims priority to China Patent Application No. CN 201810020268.X filed on Jan. 9, 2018, both of which are hereby incorporated in its entireties by reference.

FIELD OF THE INVENTION

The present invention relates to a display technology field, and more particularly to an Inkjet printing OLED display panel and a manufacturing method for the same.

BACKGROUND OF THE INVENTION

In manufacturing an OLED (Organic Light-Emitting Diode) display panel, an inkjet printing technology is adopted to manufacture pixels of the OLED panel. That kind of OLED display panel named the inkjet printing OLED display panel. To decrease the difficulty of the IJP technology, a "2 in 1" pixel structure is designed. The pixel structure is shown in FIG. 1. One pixel 10' of the inkjet printing OLED display panel includes two sub-pixels 101'. The above design can utilize the space more effectively in order to increase the resolution. In another aspect, using one printing to finish the two sub-pixels can increase the manufacturing efficiency for the sub-pixel.

In order to realize one printing to finish two sub-pixels, except an array process, a SiO process is required to form an electrode spacer layer. Firstly, depositing a SiO layer between anodes. Then, using a mask to define the pattern of the SiO layer as the electrode spacer layer. As shown in FIG. 2, two anodes 5', light-emitting layer 8' located above the two anodes 5' commonly form the two sub-pixels 101'. Between two anodes 5', an electrode spacer 6' is disposed. Numeral 9' is a cathode. Numerals 1', 2', 4', 7' are respectively a thin-film transistor, a substrate, a passivation layer, a planarization layer, and a pixel definition layer. After verification, the SiO process will cause a deterioration of the thin-film transistor.

SUMMARY OF THE INVENTION

In order to solve the above technology problem, the present invention can provide a manufacturing method for an inkjet printing OLED display panel and a manufacturing method for the same, which can save one mask, improve the performance of the thin-film transistor of the inkjet printing OLED display panel and effectively suppress the drift of the threshold voltage without decreasing the mobility of the thin-film transistor.

The present invention provides a manufacturing method for an inkjet printing OLED display panel, comprising steps of: sequentially forming a passivation layer and a planarization layer on at least one pair of thin-film transistors on a glass substrate, and the passivation layer covers the at least one pair of thin-film transistors; forming at least one pair of vias both at the passivation layer and the planarization layer; forming at least one pair of anodes on the planarization layer, wherein the least one pair of anodes are electrically connected to the least one pair of thin-film transistors through the vias at the passivation layer and the planarization layer; depositing a pixel definition layer on the planarization layer, and the pixel definition layer covers the at least one pair of anodes; using a half-tone mask to define a pattern of the pixel definition layer such that a region of the pixel definition layer located above the at least one pair of the anodes forms a notch, and a height of the pixel definition layer 61 located between the least one pair of the anodes is decreased; using an inkjet printing technology to form a light-emitting layer in the notch of the pixel definition layer, and the light-emitting layer covers the pixel definition layer located between the least one pair of anodes.

Preferably, the method further comprises a step of: manufacturing a cathode on the light-emitting layer.

Preferably, the step of using a half-tone mask to define a pattern of the pixel definition layer comprises steps of: disposing the half-tone mask to be above the pixel definition layer, a partial-light-transmitting region of the half-tone mask is located above the pixel definition layer located between the at least one pair of anodes, a light-transmitting region of the half-tone mask is located above the at least one pair of anodes, and through a yellow light to define the pattern of the pixel definition layer by the half-tone mask.

Preferably, the passivation layer includes at least one layer of SiOx and/or at least one layer of SiNx, and a thickness range of the passivation layer is 1000~5000 angstrom; and the planarization layer includes at least one photoresist layer having at least one kind of photoresist, and a thickness range of the planarization layer is 10000~20000 angstrom.

Preferably, the step of depositing an ITO (Indium Tin Oxide) material layer on the planarization layer, and utilizing the yellow light for patterning the ITO material layer in order to obtain the at least one pair of anodes, wherein a thickness range of the anode 5 is 500~1000 angstrom.

Preferably, the pixel definition layer includes at east one photoresist layer having at least one kind of photoresist, a thickness range of the pixel definition layer located at two sides of the at least one pair of anodes is 10000~20000 angstrom.

Preferably, using the yellow light to form at least one pair of vias at the passivation layer and the planarization layer.

The present invention also provides a manufacturing method for an inkjet printing OLED display panel, comprising steps of: sequentially forming a passivation layer and a planarization layer on at least one pair of thin-film transistors on a glass substrate, and the passivation layer covers the at least one pair of thin-film transistors; forming at least one pair of vias both at the passivation layer and the planarization layer; forming at least one pair of anodes on the planarization layer, wherein the least one pair of anodes are electrically, connected to the least one pair of thin-film transistors through the vias at the passivation layer and the planarization layer; depositing a pixel definition layer on the planarization layer, and the pixel definition layer covers the at least one pair of anodes; using a half-tone mask to define a pattern of the pixel definition layer such that a region of the pixel definition layer located above the at least one pair of the anodes forms a notch, and a height of the pixel definition layer 61 located between the least one pair of the anodes is decreased; using an inkjet printing technology to form a light-emitting layer in the notch of the pixel definition layer, and the light-emitting layer covers the pixel definition layer located between the least one pair of anodes; and manufacturing a cathode on the light-emitting layer.

Preferably, the step of using a half-tone mask to define a pattern of the pixel definition layer comprises steps of disposing the half-tone mask to be above the pixel definition layer, a partial-light-transmitting region of the half-tone mask is located above the pixel definition layer located between the at least one pair of anodes, a light-transmitting region of the half-tone mask is located above the at least one pair of anodes, and through a yellow light to define the pattern of the pixel definition layer by the half-tone mask.

Preferably, the passivation layer includes at least one layer of SiOx and/or at least one layer of SiNx, and a thickness range of the passivation layer is 1000~5000 angstrom, and the planarization layer includes at least one photoresist layer having at least one kind of photoresist, and a thickness range of the planarization layer is 10000~20000 angstrom.

Preferably, the step of depositing an ITO (Indium Tin Oxide) material layer on the planarization layer, and utilizing the yellow light for patterning the no material layer in order to obtain the at least one pair of anodes, wherein a thickness range of the anode is 500~1000 Angstrom.

Preferably, the pixel definition layer includes at least one photoresist layer having at least one kind of photoresist, a thickness range of the pixel definition layer located at two sides of the at least one pair of anodes is 10000~20000 angstrom.

Preferably, using the yellow light to form at least one pair of vias at the passivation layer and the planarization layer.

The present invention also provides an inkjet printing OLED display panel, comprising: at least one pair of thin-film transistors; a passivation layer and a planarization layer which are disposed sequentially and stacked above the at least one pair of thin-film transistors, wherein the passivation layer and the planarization layer both provide with at least one pair of vias, the vias at the passivation layer and the vias at the planarization layer are exactly corresponded, and are all located above the at least one pair of thin-film transistors; at least one pair of anodes disposed on the planarization layer, wherein the least one pair of anodes are electrically connected to the least one pair of thin-film transistors through the vias at the passivation layer and the vias at the planarization layer; a pixel definition layer disposed on the planarization layer, wherein the pixel definition layer includes at least one pair of notches, the at least one pair of notches are respectively located above the at least one pair of anodes, a height of the pixel definition layer located between the least one pair of anodes is less than a height of the pixel definition layer located at two sides of the least one pair of anodes; and a light-emitting layer disposed in the at least one pair of notches, and the light-emitting layer covers the pixel definition layer located between the least one pair of anodes.

Preferably, a cathode is disposed on the light-emitting layer.

Preferably, the passivation layer includes at least one layer of SiOx and/or at least one layer of SiNx, and a thickness range of the passivation layer is 1000~5000 angstrom; the planarization layer includes at least one photoresist layer having at least one kind of photoresist, and a thickness range of the planarization layer is 10000~20000 angstrom; and the pixel definition layer includes at least one photoresist layer having at least one kind of photoresist, a thickness range of the pixel definition layer located at two sides of the at least one pair of anodes is 10000~20000 angstrom.

The present invention has following beneficial effect: in the present invention, through forming the passivation layer and a planarization layer on the thin-film transistors, forming the vias at the passivation layer and a planarization layer, forming the anode on the planarization layer, the anode electrically connecting to the thin-film transistor by the vias at the passivation layer and a planarization layer, forming the pixel definition layer on the planarization layer to cover the anode, through using the half-tone mask to define the pattern of the pixel definition layer such that the pixel definition layer located above the anode forms the notch in order to form the light-emitting layer, and decrease the height of the pixel definition layer located between the anodes as an electrode spacer layer of the anode. Accordingly, when defining the pattern of the pixel definition layer in the present invention, the electrode spacer layer of the anode has been formed, a process for forming an electrode spacer layer is not required, depositing a SiO layer between the anodes and using a mask to define a pattern of the SiO layer is not required. Therefore, comparing to the manufacturing method of the conventional inkjet printing OLED display panel, one mask process can be saved in order to save the time and cost for manufacturing the inkjet printing OLED display panel.

Besides, the electrode spacer layer between the anodes adopts the material of the pixel definition layer, not the material of SiO. The pixel definition layer does not like the material of SiO, which includes hydrogen bond and hydrogen ion so that the present invention will not decrease the mobility of the thin-film transistor, and can suppress the drift of the threshold voltage without causing deterioration to the thin-film transistor of the OLED display panel.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

Figure 1:
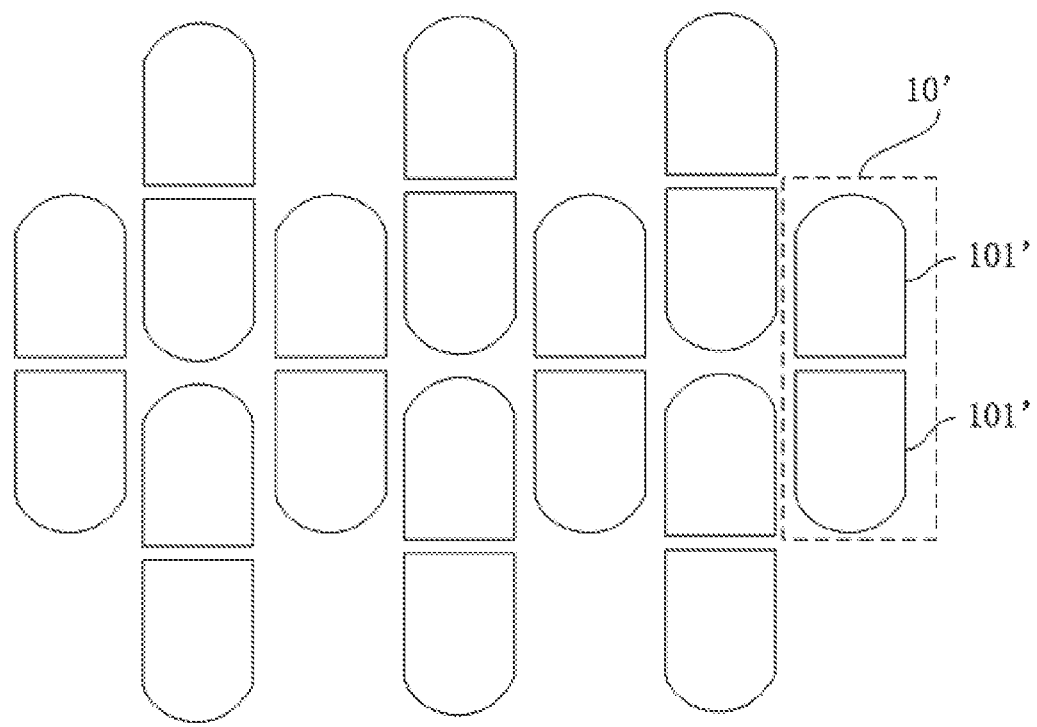
FIG. 1 is a schematic diagram of a pixel structure in an inkjet printing OLED display panel of the conventional art.
Figure 2:
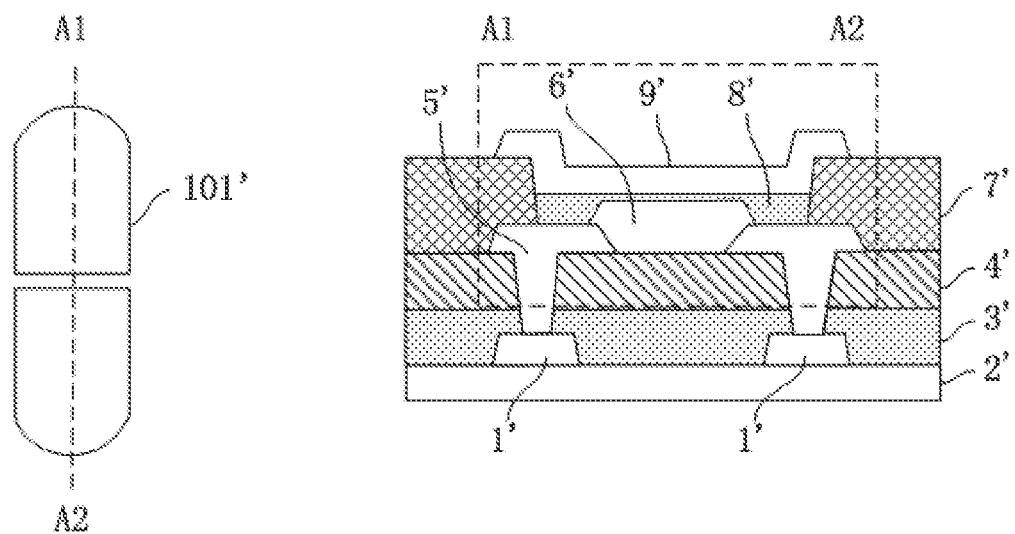
FIG. 2 is a cross-sectional view of the pixel of the conventional art.
Figure 3:
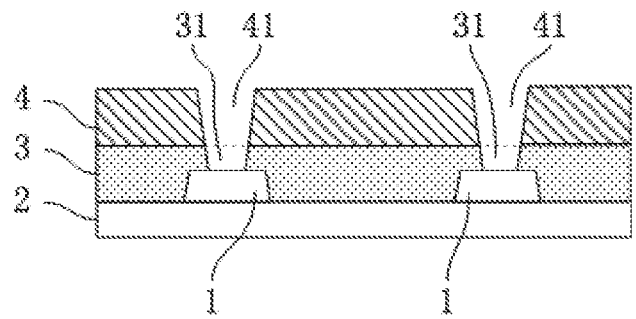
FIG. 3 is a schematic diagram of forming a passivation layer and a planarization layer on the thin-film transistor of the present invention.
Figure 4:
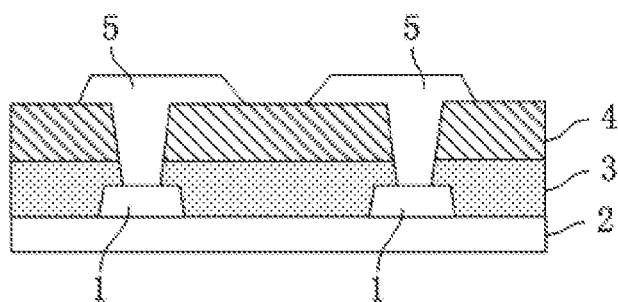
FIG. 4 is a schematic diagram of forming a pair of anodes on the planarization layer of the present invention.

The present invention provides a manufacturing method for an inkjet printing OLED display panel, and the manufacturing method comprises steps of:

As shown in FIG. 3, manufacturing at least one pair of thin-film transistors 1 on a glass substrate 2;

Depositing a passivation layer 3 on the glass substrate 2, and the passivation layer 3 covers the at least one pair of thin-film transistors 1;

Depositing a planarization layer 4 on the passivation layer 3;

Forming at least one pair of vias both at the passivation layer 3 and the planarization layer 4, the vias 31 at the passivation layer 3 and the vias 41 at the planarization layer 4 are exactly corresponded, and the vias 31 at the passivation layer 3 and the vias 41 at the planarization layer 4 are all located above the pair of thin-film transistors 1;

As shown in FIG. 4, manufacturing at least one pair of anodes 5 on the planarization layer 4, and the least one pair of anodes 5 are electrically connected to the least one pair of thin-film transistors 1 through the vias 31 at the passivation layer 3 and the vias 41 at the planarization layer 4.

Figure 5:
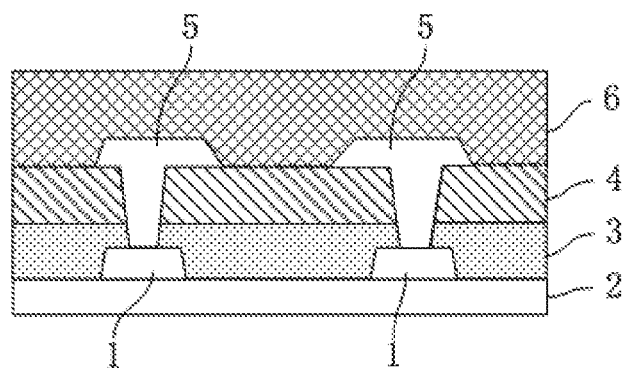
FIG. 5 is a schematic diagram of forming a pixel definition layer on the planarization layer of the present invention.

As shown in FIG. 5, depositing a pixel definition layer 6 on the planarization layer 4, and the pixel definition layer 6 covers the at least one pair of anodes 5.

Figure 6:
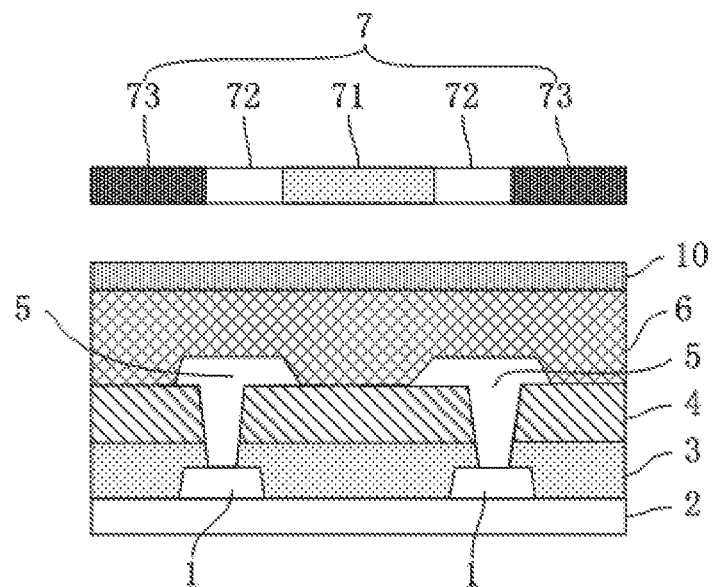
FIG. 6 is a schematic diagram of forming a pattern of the pixel definition layer using a half-tone mask shown in FIG. 5 of the present invention.
Figure 7:
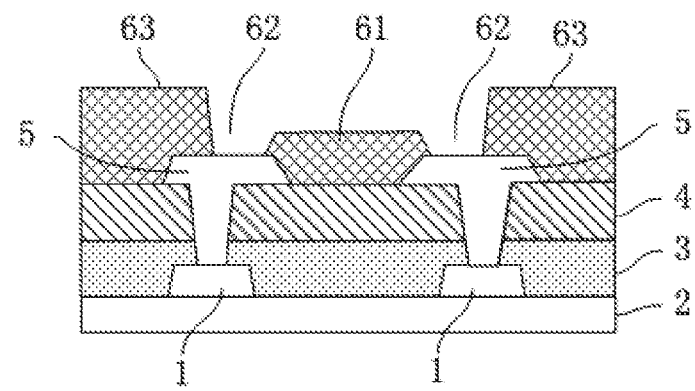
FIG. 7 is a schematic diagram of a pattern of the pixel definition layer of the present invention.

Using a half-tone mask 7 as shown in FIG. 6 to define a pattern of the pixel definition layer 6. As shown in FIG. 7, a region of the pixel definition layer 6 located above the at least one pair of the anodes 5 forms a notch 62. The at least one pair of anodes 5 are exposed through the notch 62 and decrease a height of the pixel definition layer 61 located between the least one pair of the anodes 5.

Figure 8:
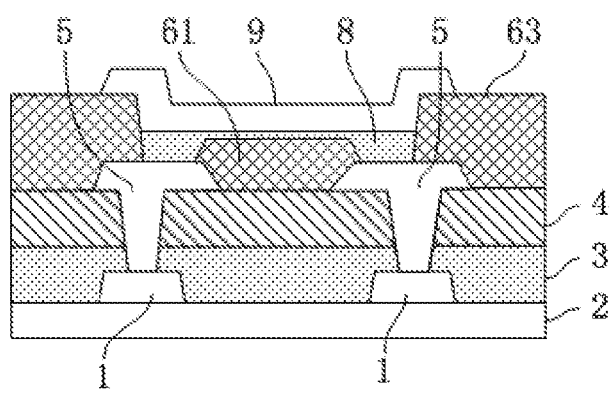
FIG. 8 is a cross-sectional diagram of the pixel in the inkjet printing OLED display panel of the present invention.

As shown in FIG. 8, manufacturing a light-emitting layer 8 in the notch 62 of the pixel definition layer using an inkjet printing technology, and the light-emitting layer 8 covers the pixel definition layer 61 located between the least one pair of anodes 5.

It should be noted that the step of defining a pattern of the pixel definition layer 6 in the present invention is generally coated a photoresist 10 on the pixel definition layer 6, and disposing the half-tone mask 7 above the pixel definition layer 6. Then, using a yellow light to perform an exposure and development to the photoresist 10 on the surface of the pixel definition layer 6 through the half-tone mask 7. Using the photoresist 10 after the exposure and development as a harrier layer to etch the pixel definition layer 6. Here, a thickness of the portion of the pixel definition layer 61 located between the at least one pair of the anodes 5 can be adjusted through adjusting an exposure amount of the yellow light.

Furthermore, the manufacturing method for the inkjet printing OLED display panel further includes following steps:

Manufacturing a cathode 9 on the light-emitting layer 8.

Furthermore, when using a half-tone mask 7 to define the pattern of the pixel definition layer, disposing the half-tone mask 7 to be above the pixel definition layer 6, a partial-light-transmitting region 71 of the half-tone mask 7 is located above the pixel definition layer 6 located between the at least one pair of anodes 5, a light-transmitting region 72 of the half-tone mask 7 is located above the at least one pair of anodes 5, and through a yellow light to define the pattern of the pixel definition layer by the half-tone mask 7. As shown in FIG. 6, a region of the half-tone mask 7 except the partial-light-transmitting region 71 and the light-transmitting region 72 is a light-blocking region 73.

Furthermore, the passivation layer 3 includes at least one layer of SiOx and/or at least one layer of SiNx, x>1, and a thickness range of the passivation layer 3 is 1000~5000 angstrom.

The planarization layer 4 includes at least one photoresist layer having at least one kind of photoresist, and a thickness range of the planarization layer 4 is 10000~20000 angstrom.

Furthermore, the step of manufacturing at least one pair of anodes 5 on the planarization layer 4 includes following steps:

Depositing an ITO (Indium Tin Oxide) material layer on the planarization layer 4, and utilizing the yellow light for patterning the ITO material layer in order to obtain the at least one pair of anodes 5. Wherein a thickness range of the anode 5 is 500~1000 angstrom.

Furthermore, the pixel definition layer includes at least one photoresist layer having at least one kind of photoresist. A thickness range of the pixel definition layer 63 located at two sides of the at least one pair of anodes 5 is 10000~20000 angstrom.

Furthermore, using the yellow light to form at least one pair of vias at the passivation layer 3 and the planarization layer 4.

In the present invention, when forming the vias at the passivation layer 3 and the planarization layer 4, coating a photoresist layer on the planarization layer 4, then, exposing and developing the photoresist layer using the yellow light. Using the photoresist layer after being exposed and developed as a barrier layer to perform an etching to the passivation layer 3 and the planarization layer 4 in order to form the vias.

The present invention also provides an inkjet printing OLED display panel. As shown in FIG. 8, the inkjet printing OLED display panel includes: at least one pair of thin-film transistors 1, a passivation layer 3 and a planarization layer 4 which are disposed sequentially and stacked above the at least one pair of thin-film transistors 1. The passivation layer 3 and the planarization layer 4 both provide with at least one pair of vias. The vias 31 at the passivation layer 3 and the vias 41 at the planarization layer 4 are exactly corresponded, and are all located above the at least one pair of thin-film transistors 1. At least one pair of anodes 5 are disposed on the planarization layer 4, and the least one pair of anodes 5 are electrically connected to the least one pair of thin-film transistors 1 through the vias 31 at the passivation layer 3 and the vias 41 at the planarization layer 4.

A pixel definition layer 6 is disposed on the planarization layer 4, and the pixel definition layer 6 includes at least one pair of notches 62 shown in FIG. 7. The at least one pair of notches 62 are respectively located above the at least one pair of anodes 5. A height of the pixel definition layer 61 located between the least one pair of anodes 5 is less than a height of the pixel definition layer 63 located at two sides of the least one pair of anodes 5.

A light-emitting layer 8 is disposed in the at least one pair of notches 62, and the light-emitting layer 8 covers the pixel definition layer located between the least one pair of anodes 5. A cathode 9 is disposed on the light-emitting layer 8.

Furthermore, the passivation layer 3 includes at least one layer of SiOx and/or at least one layer of SiNx, x>1, and a thickness range of the passivation layer 3 is 1000~5000 angstrom.

The planarization layer 4 includes at least one photoresist layer having at least one kind of photoresist, and a thickness range of the planarization layer is 10000~20000 angstrom.

Furthermore, the pixel definition layer includes at least one photoresist layer having at least one kind of photoresist, a thickness range of the pixel definition layer 63 located at two sides of the at least one pair of anodes 5 is 10000~20000 angstrom.

In summary, in the present invention, through forming the passivation layer 3 and a planarization layer 4 on the thin-film transistors 1, forming the vias 31, 41 at the passivation layer 3 and a planarization layer 4, forming the anode 5 on the planarization layer 4, the anode 5 electrically connecting to the thin-film transistor 1 by the vias 31, 41 at the passivation layer 3 and a planarization layer 4, forming the pixel definition layer 6 on the planarization layer 4 to cover the anode 5, through using the half-tone mask 7 to define the pattern of the pixel definition layer such that the pixel definition layer located above the anode 5 forms the notch 62 in order to form the light-emitting layer 8, and decrease the height of the pixel definition layer 61 located between the anodes 5 as an electrode spacer layer of the anode 5. Accordingly, when defining the pattern of the pixel definition layer in the present invention, the electrode spacer layer of the anode 5 has been formed, a process for forming an electrode spacer layer is not required, depositing a SiO layer between the anodes and using a mask to define a pattern of the SiO layer is not required. Therefore, comparing to the manufacturing method of the conventional inkjet printing OILED display panel, one mask process can be saved in order to save the time and cost for manufacturing the inkjet printing OLED display panel.

Besides, the electrode spacer layer between the anodes adopts the material of the pixel definition layer, not the material of SiO. The pixel definition layer does not like the material of SiO, which includes hydrogen bond and hydrogen ion so that the present invention will not decrease the mobility of the thin-film transistor, and can suppress the drift of the threshold voltage without causing deterioration to the thin-film transistor of the OLED display panel.

The inkjet printing OLED display panel adopts the inkjet printing technology, and can print two sub-pixels at the same time, which can increase the resolution of the OLED display panel, and reduce the difficulty of the inkjet printing technology.

The compound adhesive structure and a display panel provided by the embodiment of the present invention has following beneficial effects: multiple flexible enhancement bodies which are disposed on a surface of the optical adhesive body and/or inside the optical adhesive body and arranged along a preset direction, wherein each of the flexible enhancement bodies includes a large end and a small end which is gradually narrowing in cross section from the large end, wherein a refractive index of each of the flexible enhancement bodies is similar to a refractive index of the optical adhesive body, and a density of each of the flexible enhancement bodies is similar to a density of the optical adhesive body. The present invention can suppress and break a viscosity flowing of the optical adhesive in the bending and deformation process of the display panel, and improve a wrinkle phenomenon in the bending process of the display panel.

What is claimed is:

1. A manufacturing method for an inkjet printing organic light-emitting diode (OLED) display panel, comprising steps of:
    sequentially forming a passivation layer and a planarization layer on at least one pair of thin-film transistors on a glass substrate, and the passivation layer covers the at least one pair of thin-film transistors;
    forming at least one pair of vias both at the passivation layer and the planarization layer;
    forming at least one pair of anodes on the planarization layer, wherein the least one pair of anodes are electrically connected to the least one pair of thin-film transistors through the vias at the passivation layer and the planarization layer;
    depositing a pixel definition layer of a single material on the planarization layer, and the pixel definition layer covers the at least one pair of anodes;
    using a half-tone mask to pattern the single material and define a pattern of the pixel definition layer by partially removing the single material to form a recessed area that is defined and delimited by a portion of the single material, a part of the single material being preserved in the recessed area and located between the least one pair of the anodes, such that a region of the pixel definition layer located above each of the at least one pair of the anodes forms a notch corresponding to the anode, wherein a height of the part of the single material preserved in the recessed area and located between the least one pair of the anodes is decreased and a top surface of the part of the single material preserved in the recessed area and located between the at least one pair of the anodes is lower than a top surface of the portion of the single material that defines and delimits the recessed area;
    using an inkjet printing technology to form a light-emitting layer in the recessed area of the pixel definition layer, wherein the light-emitting layer is in contact with each of the at least one pair of anodes so that the light-emitting layer is in contact with plural anodes of the at least one pair of anodes and extends over and covers the pixel definition layer located between the plural anodes of the at least one pair of anodes, wherein the light-emitting layer is completely received in the recessed area and has a height that is greater than the height of the part of the single material preserved in the recessed area and located between the at least one pair of the anodes and smaller than the height of the portion of the single material that defines and delimits the recessed area, wherein the light-emitting layer covers the part of the single material preserved in the recessed area and located between the at least one pair of the anodes and does not cover the portion of the single material that defines and delimits the recessed area.

2. The manufacturing method for an inkjet printing OLED display panel according to claim 1, wherein the method further comprises a step of:
    manufacturing a cathode on the light-emitting layer.

3. The manufacturing method for an inkjet printing OLED display panel according to claim 1, wherein the step of using a half-tone mask to define a pattern of the pixel definition layer comprises steps of:
    disposing the half-tone mask to be above the pixel definition layer, a partial-light-transmitting region of the half-tone mask is located above the pixel definition layer located between the at least one pair of anodes, a light-transmitting region of the half-tone mask is located above the at least one pair of anodes, and through a yellow light to define the pattern of the pixel definition layer by the half-tone mask.

4. The manufacturing method for an inkjet printing OLED display panel according to claim 1, wherein the passivation layer includes at least one layer of SiOx and/or at least one layer of SiNx, and a thickness range of the passivation layer is 1000~5000 angstrom; and
    the planarization layer includes at least one photoresist layer having at least one kind of photoresist, and a thickness range of the planarization layer is 10000~20000 angstrom.

5. The manufacturing method for an inkjet printing OLED display panel according to claim 1, wherein the step of depositing an ITO (Indium Tin Oxide) material layer on the planarization layer, and utilizing the yellow light for patterning the ITO material layer in order to obtain the at least one pair of anodes, wherein a thickness range of the anode 5 is 500~1000 angstrom.

6. The manufacturing method for an inkjet printing OLED display panel according to claim 1, wherein the pixel definition layer includes at least one photoresist layer having at least one kind of photoresist, a thickness range of the pixel definition layer located at two sides of the at least one pair of anodes is 10000~20000 angstrom.

7. The manufacturing method for an inkjet printing OLED display panel according to claim 1, wherein using the yellow light to form at least one pair of vias at the passivation layer and the planarization layer.

8. A manufacturing method for an inkjet printing organic light-emitting diode (OLED) display panel, comprising steps of:
sequentially forming a passivation layer and a planarization layer on at least one pair of thin-film transistors on a glass substrate, and the passivation layer covers the at least one pair of thin-film transistors;
forming at least one pair of vias both at the passivation layer and the planarization layer;
forming at least one pair of anodes on the planarization layer, wherein the least one pair of anodes are electrically connected to the least one pair of thin-film transistors through the vias at the passivation layer and the planarization layer;
depositing a pixel definition layer of a single material on the planarization layer, and the pixel definition layer covers the at least one pair of anodes;
using a half-tone mask to pattern the single material and define a pattern of the pixel definition layer by partially removing the single material to form a recessed area that is defined and delimited by a portion of the single material, a part of the single material being preserved in the recessed area and located between the least one pair of the anodes, such that a region of the pixel definition layer located above each of the at least one pair of the anodes forms a notch corresponding to the anode, wherein a height of the part of the single material preserved in the recessed area and located between the least one pair of the anodes is decreased and a top surface of the part of the single material preserved in the recessed area and located between the at least one pair of the anodes is lower than a top surface of the portion of the single material that defines and delimits the recessed area;
using an inkjet printing technology to form a light-emitting layer in the recessed area of the pixel definition layer, wherein the light-emitting layer is in contact with each of the at least one pair of anodes so that the light-emitting layer is in contact with plural anodes of the at least one pair of anodes and extends over and covers the pixel definition layer located between the plural anodes of the at least one pair of anodes, wherein the light-emitting layer is completely received in the recessed area and has a height that is greater than the height of the part of the single material preserved in the recessed area and located between the at least one pair of the anodes and smaller than the height of the portion of the single material that defines and delimits the recessed area, wherein the light-emitting layer covers the part of the single material preserved in the recessed area and located between the at least one pair of the anodes and does not cover the portion of the single material that defines and delimits the recessed area; and
manufacturing a cathode on the light-emitting layer.

9. The manufacturing method for an inkjet printing OLED display panel according to claim 8, wherein the step of using a half-tone mask to define a pattern of the pixel definition layer comprises steps of:
disposing the half-tone mask to be above the pixel definition layer, a partial-light-transmitting region of the half-tone mask is located above the pixel definition layer located between the at least one pair of anodes, a light-transmitting region of the half-tone mask is located above the at least one pair of anodes, and through a yellow light to define the pattern of the pixel definition layer by the half-tone mask.

10. The manufacturing method for an inkjet printing OLED display panel according to claim 8, wherein the passivation layer includes at least one layer of SiOx and/or at least one layer of SiNx, and a thickness range of the passivation layer is 1000~5000 angstrom; and
the planarization layer includes at least one photoresist layer having at least one kind of photoresist, and a thickness range of the planarization layer is 10000~20000 angstrom.

11. The manufacturing method for an inkjet printing OLED display panel according to claim 8, wherein the step of depositing an ITO (Indium Tin Oxide) material layer on the planarization layer, and utilizing the yellow light for patterning the ITO material layer in order to obtain the at least one pair of anodes, wherein a thickness range of the anode is 500~1000 angstrom.

12. The manufacturing method for an inkjet printing OLED display panel according to claim 8, wherein the pixel definition layer includes at least one photoresist layer having at least one kind of photoresist, a thickness range of the pixel definition layer located at two sides of the at least one pair of anodes is 10000~20000 angstrom.

13. The manufacturing method for an inkjet printing OLED display panel according to claim 8, wherein using the yellow light to form at least one pair of vias at the passivation layer and the planarization layer.

14. An inkjet printing organic light-emitting diode (OLED) display panel, comprising:
at least one pair of thin-film transistors;
a passivation layer and a planarization layer which are disposed sequentially and stacked above the at least one pair of thin-film transistors, wherein the passivation layer and the planarization layer both provide with at least one pair of vias, the vias at the passivation layer and the vias at the planarization layer are exactly corresponded, and are all located above the at least one pair of thin-film transistors;
at least one pair of anodes disposed on the planarization layer, wherein the least one pair of anodes are electrically connected to the least one pair of thin-film transistors through the vias at the passivation layer and the vias at the planarization layer;
a pixel definition layer of a single material disposed on the planarization layer, wherein the single material is partially removed to form a recessed area that is defined and delimited by a portion of the single material such that the pixel definition layer includes at least one pair of notches, the at least one pair of notches being respectively located above the at least one pair of anodes, a part of the single material being preserved in the recessed area and located between the least one pair of the anodes such that a height of the part of the single material preserved in the recessed area and located between the least one pair of anodes is less than a height of the portion of the single material that defines and delimits the recessed area and a top surface of the part of the single material preserved in the recessed area and located between the least one pair of the anodes is lower than a top surface of the portion of the single material that defines and delimits the recessed area; and a light-emitting layer disposed in the recessed area of the pixel definition layer, wherein the light-emitting layer is in contact with each of the at least one pair of anodes so that the light-emitting layer is in contact with plural anodes of the at least one pair of anodes and extends over and covers the pixel definition layer located between the plural anodes of the at least one pair of anodes wherein the light-emitting layer is completely received in the recessed area and has a height that is greater than the height of the part of the single material preserved in the recessed area and located between the at least one pair of the anodes and smaller than the height of the portion of the single material that defines and delimits the recessed area, wherein the light-emitting layer covers the part of the single material preserved in the recessed area and located between the at least one pair of the anodes and does not cover the portion of the single material that defines and delimits the recessed area.

15. The inkjet printing OLED display panel according to claim 14, wherein a cathode is disposed on the light-emitting layer.

16. The inkjet printing OLED display panel according to claim 14, wherein the passivation layer includes at least one layer of SiOx and/or at least one layer of SiNx, and a thickness range of the passivation layer is 1000~5000 angstrom;

the planarization layer includes at least one photoresist layer having at least one kind of photoresist, and a thickness range of the planarization layer is 10000~20000 angstrom; and the pixel definition layer includes at least one photoresist layer having at least one kind of photoresist, a thickness range of the pixel definition layer located at two sides of the at least one pair of anodes is 10000~20000 angstrom.

* * * * *